(12) United States Patent
Chiu

(10) Patent No.: US 6,519,154 B1
(45) Date of Patent: Feb. 11, 2003

(54) THERMAL BUS DESIGN TO COOL A MICROELECTRONIC DIE

(75) Inventor: Chia-Pin Chiu, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/932,636

(22) Filed: Aug. 17, 2001

(51) Int. Cl.$^7$ ................................................ H05K 7/20
(52) U.S. Cl. ........................ 361/704; 361/707; 361/710; 361/720; 257/706; 257/717; 174/16.3; 165/80.2; 165/80.3; 165/185
(58) Field of Search .................. 361/702–710, 361/760, 712–714, 717, 718, 719; 165/80.2, 80.3, 185; 174/16.3; 257/706, 712, 717, 718, 721, 722

(56) References Cited

U.S. PATENT DOCUMENTS

| | | | | |
|---|---|---|---|---|
| 5,866,943 A | * | 2/1999 | Mertol | 257/712 |
| 6,008,536 A | * | 12/1999 | Mertol | 257/704 |
| 6,014,314 A | * | 1/2000 | Mikubo | 361/704 |
| 6,184,580 B1 | * | 2/2001 | Lin | 257/712 |
| 6,188,578 B1 | * | 2/2001 | Lin et al. | 361/717 |
| 6,229,702 B1 | * | 5/2001 | Tao et al. | 361/704 |
| 6,246,583 B1 | * | 6/2001 | Cronin et al. | 361/704 |
| 6,351,194 B2 | * | 2/2002 | Takahashi et al. | 333/133 |

* cited by examiner

Primary Examiner—Boris Chervinsky
(74) Attorney, Agent, or Firm—Schwegman, Lundberg, Woessner & Kluth P.A.

(57) ABSTRACT

A novel thermal bus is shown that more effectively transmits heat away from a die of an IC. The innovative thermal bus is capable of transmitting heat to other heat dissipating devices such as heat sinks, which eventually transmit the heat out to ambient. One aspect of the thermal bus leading to increased performance includes an added path for conducting heat in addition to the path through the backside of the die. Another aspect of the thermal bus leading to increased performance includes coupling the thermal bus to the active side of the die to more directly transmit heat from the electronic devices that are generating the heat. Local hot spots are therefore minimized, and the overall average temperature of the die is reduced, which allows improved performance of the microelectronic chip, such as operating at a higher frequency for a given upper threshold temperature.

22 Claims, 3 Drawing Sheets

THERMAL BUS DESIGN TO COOL A MICROELECTRONIC DIE

TECHNICAL FIELD OF THE INVENTION

The present invention relates generally to the field of heat transfer and, in particular, the present invention relates to thermal management of microelectronic electronic devices.

BACKGROUND

In one embodiment, the present invention is used to transfer heat generated by electronic devices or groups of devices, such as transistors, as are commonly included on integrated circuit (IC) chips. A brief discussion of some electronic systems using IC's, such as personal computers or lower level computer components, is included below to show some possible areas of application for the present invention.

IC's are typically formed on microelectronic dies and assembled into microelectronic packages by physically and electrically coupling them to a package substrate made of organic or ceramic material. One or more microelectronic packages can be physically and electrically coupled to a printed circuit board (PCB) to form an "electronic assembly". The "electronic assembly" can be part of an "electronic system". An "electronic system" is broadly defined herein as any product comprising an "electronic assembly". Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, MP3 (Motion Picture Experts Group, Audio Layer 3) players, etc.), and the like.

An IC is fabricated on a microelectronic die that may comprise a number of metal layers selectively patterned to provide metal interconnect lines (referred to herein as "traces"), and one or more electronic devices attached in or on one or more surfaces of the microelectronic die. The electronic device or devices are functionally connected to other elements of an electronic system through a hierarchy of electrically conductive paths that include the metal traces. The traces typically carry signals that are transmitted between the electronic devices, such as transistors, of the IC. Electronic devices and traces can be configured in an IC to form processors.

In the field of electronic systems there is an incessant competitive pressure among manufacturers to drive the performance of their equipment up while driving down production costs. This is particularly true regarding forming electronic devices such as transistors in IC's, where each new generation of IC must provide increased performance, particularly in terms of an increased number of devices and higher clock frequencies, while generally being smaller or more compact in size. As the density and clock frequency of IC's increase, they accordingly generate a greater amount of heat. However, the performance and reliability of IC's are known to diminish as the temperature to which they are subjected increases, so it becomes increasingly important to adequately dissipate heat from IC environments.

Additionally, specific areas of a die on which an IC is formed are often more frequently used than other areas of the die. For example, a floating point unit (FPU) area will typically generate a higher amount of heat than other areas on the die. These areas lead to "hot spots" on the die that significantly increase the local temperature surrounding these hot spots, and also elevate the overall average temperature of the die.

FIG. 1 illustrates a cross-sectional representation of a common configuration microelectronic package 30. Microelectronic package 30 represents a typical structure that includes a microelectronic die 40 mounted in "flip-chip" orientation with its active side 44 facing downward to couple with electrical contacts or lands on the package substrate 50. Solder balls or bumps 42 make the electrical connection with the contacts on the package substrate, while an underfill material 52 maintains a mechanical bond between the microelectronic die 40 and the package substrate 50. The package substrate 50 can include additional lands 54 and solder balls 56 on its opposite surface for mating with additional packaging structure (not shown).

Die 40 generates its heat from internal structure, including wiring traces, that is located near its active side 44. However, a significant portion of the heat is dissipated through its back side 46. Heat that is concentrated within the die is dissipated to a large surface that is in contact with the die in the form of a thermally conductive package cover 60. To improve the thermal conductivity between the die and the package, cover 60, a first thermal interface material (TIM) 70 is often provided between the die and package cover 60. To further dissipate heat from the package cover 60, a heat sink 80 optionally having heat fins 82 is often coupled to the package cover 60. Heat sink 80 dissipates heat into the ambient environment. A second layer of TIM 75 may be included between the package cover 60 and the heat sink 80 to further facilitate the conduction of heat to the heat sink 80 and out to ambient. Arrows 84 show the conduction of heat from the microelectronic die 40 out to the heat sink 80, where the heat is transmitted to ambient.

FIG. 2 schematically shows the resistance to the flow of heat generated in the microelectronic package from FIG. 1. The resistor symbols represent the thermal resistance through the thickness of each material noted. The shaded circles represent the interfaces between the various materials. In this schematic, heat is conducted from a heat generating electronic device, such as a transistor junction, through the microelectronic die 40 to the backside 46 of the die, through the first TIM 70, and into the package cover 60.

A device 210 is schematically located on the active side 44 of the microelectronic die 40. The die resistance 220 is shown from the device 210, to the backside 46 of the microelectronic die 40. The die/TIM interface 230 is between the backside 46 of the die and the first TIM 70. The first TIM resistance 240 is shown from the die/TIM interface 230 to the package cover 60, which defines a TIM/cover interface 250.

For ease of discussion, any conducting member resistance or thermal resistance associated with the interfaces is included in the bulk resistance values. The calculation for total thermal resistance of a single conduction path with multiple materials in series is defined as:

$$R_{tot} = R_1 + R_2 \ldots + R_n \quad \text{Equation 1:}$$

where $R_1$ to $R_n$ represent the thermal resistance values of the individual materials. A typical thermal resistance value for bulk silicon is 2.5 C/W and a typical value for a first TIM is 0.5 C/W. A typical total thermal resistance ($R_{tot}$) for the system in FIG. 2 would therefore be 2.5 C/W+0.5 C/W=3.0 C/W.

With the advent of high performance IC's and their associated packages, electronic devices have required more innovative thermal management to, dissipate heat. Increasing speed and power in processors, for example, generally carry with it a "cost" of increased heat in the microelectronic die that must be dissipated. What is needed is a device and method to more effectively cool microelectronic dies containing IC's such as processors. What is also needed is a device and method that can specifically cool local hot spots on a microelectronic die.

DETAILED DESCRIPTION

Figure 1:
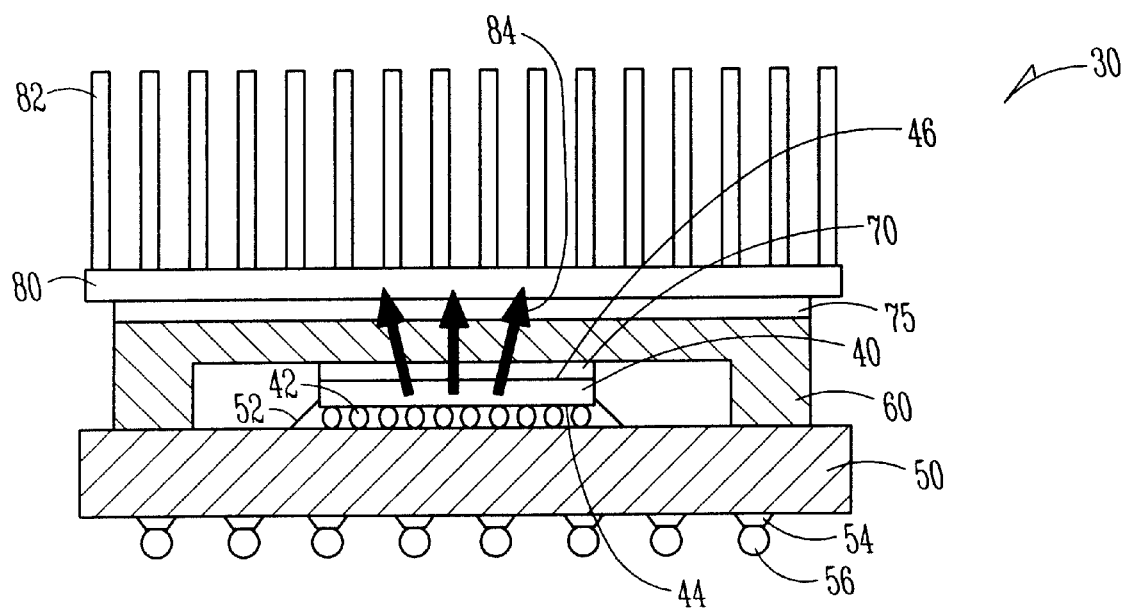
FIG. 1 shows a cross section of a common microelectronic package.
Figure 2:
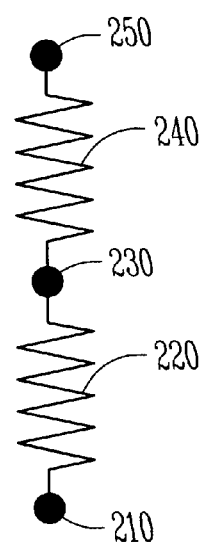
FIG. 2 shows a thermal resistance schematic diagram of the microelectronic package from FIG. 1.

In the following detailed description of the invention reference is made to the accompanying drawings which form a part hereof, and in which are shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized, and structural, logical, and electrical changes may be made, without departing from the scope of the present invention. The following detailed description is, therefore, not to be taken in a limiting sense, and the scope of the present invention is defined only by the appended claims.

The term "active side" as used in this description is defined as the conventional horizontal, large plane or surface of a chip or die where electrical devices have typically been fabricated, regardless of the orientation of the chip or die. The term "back side" as used in this description is defined as a conventional horizontal, large plane or surface of a chip or die that generally does not contain active devices on it's surface. The term "vertical" refers to a direction perpendicular to the horizontal as defined above. Prepositions, such as "on", "higher", "lower", "above" and "below" are defined with respect to the conventional plane or surface being on the active side of the chip or die, regardless of the orientation of the chip or die.

Figure 3:
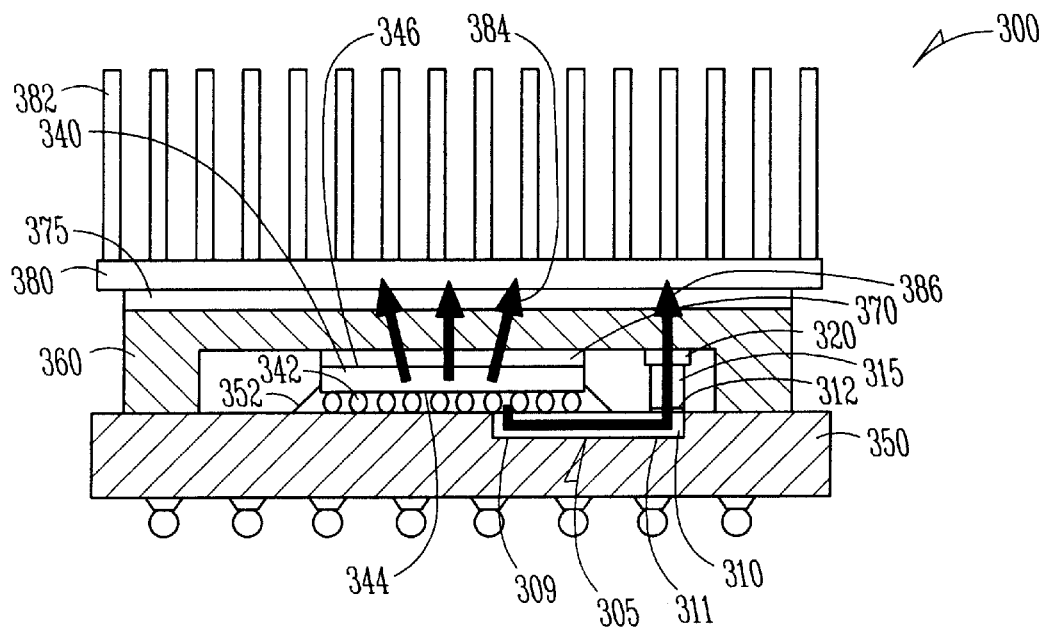
FIG. 3 shows a cross section of a microelectronic/package according to one embodiment of the invention.

FIG. 3 shows one embodiment of a microelectronic package 300. The microelectronic package 300 includes a microelectronic die 340 mounted in "flip-chip" orientation with its active side 344 facing downward to couple with electrical contacts or lands on the package substrate 350. Solder balls or bumps 342 make the electrical connection with the contacts on the package substrate, while an underfill material 352 maintains a mechanical bond between the microelectronic die 340 and the package substrate 350. Although solder balls 342 and underfill 352 are shown connecting the microelectronic die 340 to the package substrate 350, other mounting techniques known in the art, such as surface mount technology, are also contemplated within the scope of the invention. The present invention is applicable in conjunction with any mounting technique used to mount the microelectronic die 340 with it's active side 344 against a package substrate 350. The die shown will typically include bulk silicon, however other microelectronic materials such as gallium arsenide may also be used within the scope of the invention.

The microelectronic package in FIG. 3 also includes a thermally conductive package cover 360, that is in thermal communication with a backside 346 of the microelectronic die 340 through a first Thermal Interface Material (TIM) 370. TIMs are known in the art, and typically consist of a silicone based grease filled with conductive particles such as aluminum or aluminum nitride. Other TIMs may include solder. While a thermally conductive package cover 360 is shown in this embodiment, any of a number of heat transfer devices could be coupled to the backside of the microelectronic die 340. The package cover 360 is in thermal communication with a heat sink 380, the heat sink 380 optionally having a number of fins 382 to better dissipate heat to ambient. The package cover 360 is in thermal communication with the heat sink 380 through a second TIM 375.

Heat generated by electronic devices such as transistor junctions located on the active side 344 of the microelectronic die 340 is transmitted by a first conduction path 384 through the backside 346 of the microelectronic die 340 as indicated by the conduction path arrows 384. Heat is transmitted along the first conduction path 384 from a heat generating device, through the bulk of the microelectronic die 340, through the first TIM 370, and into the package cover 360. Although in this embodiment, heat is further transferred from the package cover 360, through the second TIM 375, into the heat sink 380, and out to ambient, several alternative methods of cooling the die may be used once the heat is moved to the package cover 360. Additionally, fans or heat pipes may be used in combination with the invention to further facilitate heat transfer away from the microelectronic die 340.

FIG. 3 further shows a thermal bus 305 partially embedded in the package substrate 350. The thermal bus 305 in this embodiment includes a thermally conductive layer 310, the layer having a first portion 309 and a second portion 311. The first portion 309 is located between the active side 344 of the die, and the package substrate 350. The first portion 309 is in thermal communication with the active side 344 of the die. In this embodiment, the thermal communication with the active side 344 is facilitated by conducting heat from the active side 344, through the solder balls 342 and the underfill 352, to the first portion 309, which is in direct contact with the solder balls 342 and underfill 352. The second portion 311 is laterally spaced apart from the microelectronic die 340. This feature is important because it allows the heat being conducted through the layer 310 to be transported around the microelectronic die 340 in contrast to solely transporting the heat through the die as in the prior art.

A conducting member 315 is coupled to the second portion 311 of the layer 310. In this embodiment, the conducting member is soldered to the layer 310 as indicated by solder layer 312. The conducting member 315 transmits heat from the second portion 311 to the thermally conductive package cover 360. While a thermally conductive package cover 360 is shown in this embodiment, any of a number of heat transfer devices could be coupled to the conducting member 315. In this embodiment, the conducting member 315 is coupled to the package cover 360 by a third TIM 320. It should be noted that the various TIMs in the invention may include a single composition in each location, or different compositions for each TIM may be used.

Using this embodiment, heat can be conducted away from devices on the active side 344 of the microelectronic die 340 more directly from the active side of the die in contrast to conducting through the bulk of the microelectronic die 340 as shown; in the prior art. Using this embodiment, heat can also be conducted through two different conduction paths in contrast to the single conduction path described in the prior art. As shown in FIG. 3, a second conduction path 386 is included in addition to the first conduction path 384. Although two different conduction paths are shown in this embodiment, the novel second conduction path 386 may also be used alone.

Although the thermal bus 305 shown in FIG. 3 is comprised of a number of different components that are thermally coupled, the thermal bus need not contain multiple components such as the conducting layer 310 and the conducting member 315. An important functional aspect of the thermal bus 305 is that it conducts heat away from near the active side 344 of the microelectronic die 340, around to a lateral side of the microelectronic die 340 instead of through the microelectronic die 340. Although only a single thermal bus 305 is shown in this embodiment, a number of thermal busses could be used to specifically cool a number of hot spots on the microelectronic die 340.

Figure 4:
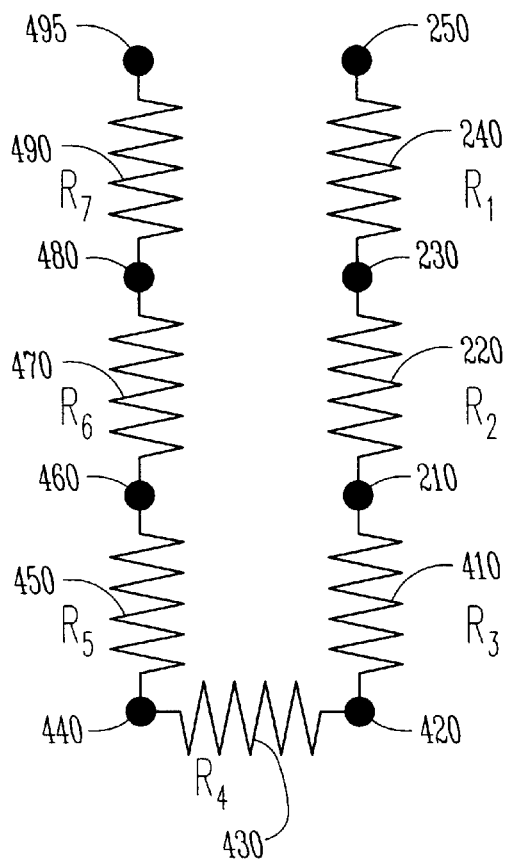
FIG. 4 shows a thermal resistance schematic diagram of the microelectronic package from FIG. 3.

FIG. 4 schematically shows the resistance to the flow of heat generated in the microelectronic package from FIG. 3. The resistor symbols represent the thermal resistance through the thickness of each material noted. The shaded circles represent the interfaces between the various components or materials. The schematic in FIG. 4 illustrates how heat is conducted along the first conduction path 384 from FIG. 3, starting at a heat generating electronic device, such as a transistor junction, through the microelectronic die 340 to the backside 346 of the die, through the first TIM 370, and into the package cover 360.

Similar to the device shown in FIG. 1, FIG. 4 shows a device 210 schematically located on the active side 344 of the microelectronic die 340. The die resistance 220 is shown from the device 210, to the backside 346 of the microelectronic die 346. The die/TIM interface 230 is between the backside 346 of the die and the first TIM 370. The first TIM resistance 240 is shown from the die/TIM interface 230 to the package cover 360, which defines a TIM/cover interface 250. This path of FIG. 4 illustrates the first conduction path 384 from FIG. 3.

The schematic in FIG. 4 also illustrates how heat is conducted along the second conduction path 386 from FIG. 3, starting at a heat generating electronic device, such as a transistor junction, through a composite layer of solder bumps 342 and underfill 352, into the conducting layer 310, through the solder 312, into the conducting member 315, through the third TIM 320, and into the package cover 360.

A conducting layer/solder-underfill interface 420 is shown between the composite layer of solder bumps 342 and underfill 352, and the conducting layer 310. The composite layer resistance 410 is shown from the device 210, to the conducting layer/solder-underfill interface 420. A conducting layer/solder interface 440 is between the conducting layer 310 and the solder 312. The conducting layer resistance 430 is shown from the conducting layer/solder-underfill interface 420 to the conducting layer/solder interface 440. A solder/conducting member interface 460 is between the solder 312 and the conducting member 315. The solder resistance 450 is shown from the conducting layer/solder interface 440 to the solder/conducting member interface 460. A conducting member/TIM interface 480 is between the conducting member 315 and the third TIM 320. The conducting member resistance 470 is shown from the solder/conducting member interface 460 to the conducting member/TIM interface 480. A TIM/cover interface 495 is between the third TIM 320 and the package cover 360. The third TIM resistance 490 is shown from the conducting member/TIM interface 480 to the TIM/cover interface 495. This path of FIG. 4 illustrates the second conduction path 386 from FIG. 3.

For ease of discussion, any conducting member resistance or thermal resistance associated with the interfaces is included in the bulk resistance values. The calculation for total thermal resistance of dual parallel conduction paths with multiple materials in series is defined in Equations 2–4.

$$R_{tot}=(R_a*R_b)/(R_a+R_b) \qquad \text{Equation 2:}$$

$$R_a=R_1+R_2 \qquad \text{Equation 2:}$$

$$R_b=R_3+R_4+R_5+R_6+R_7 \qquad \text{Equation 4:}$$

where $R_a$ and $R_b$ represent the thermal resistances of the two conduction paths, and $R_1$ to $R_7$ represent the thermal resistance values of the individual materials.

Typical thermal resistance values for the materials in Equation 3 are as follows:

bulk silicon=2.5 C/W first TIM=0.5 C/W

A typical thermal resistance for $R_a$ would therefore be 2.5 C/W+0.5 C/W=3.0 C/W.

Typical thermal resistance values for the materials in Equation 4 are as follows:

composite layer resistance 410=0.5 C/W conducting layer resistance 430=1.25 C/W solder resistance 450=0.1 C/W conducting member resistance 470=0.08 C/W third TIM resistance 490=1.0 C/W A typical thermal resistance for $R_b$ would therefore be 0.5 C/W+1.25 C/W+0.1 C/W+0.08 C/W+1.0 C/W=2.93 C/W.

The total thermal resistance ($R_{tot}$) for the system in FIG. 4 would therefore be (3.0 C/W*2.93 C/W)/(3.0 C/W+2.93 C/W)=1.48 C/W, which is approximately 50% lower than the 3.0 C/W of the prior art.

Figure 5:
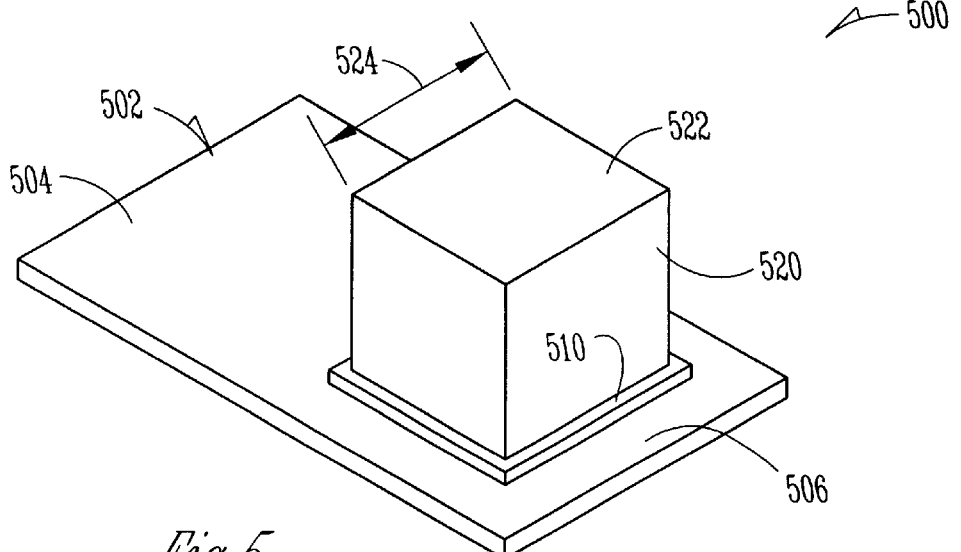
FIG. 5 shows a perspective view of a thermal bus according to one embodiment of the invention.

FIG. 5 shows one embodiment of a thermal bus 500. A conducting layer 502 is shown with a first portion 504 and a second portion 506. A conducting member 520 is shown coupled to the conducting layer 502 by a solder layer 510. As previously discussed, the conducting member may be coupled the conducting layer 502 by any of several methods, provided the conducting member 520 is in thermal communication with the conducting layer 502. The configuration used must be capable of conducting heat from the first portion 504, through the conducting layer 502 to the second portion 506, and into the conducting member 520 to a top portion 522 of the conducting member. In this embodiment, the conducting member is shaped in a rectangular form with square cross section dimensions 524 approximately equal to 0.5 cm. One skilled in the art will understand that the conducting member may be designed with any of a number of cross sections, such as a circle, or a rectangle, or other complex shapes. The conducting layer, likewise, may be designed in several configurations other than rectangular as shown in FIG. 5.

It will also be understood that although this embodiment shows two components soldered together to form the thermal bus 500, a single component bus could be used, as well as more than two components provided there is thermal communication between the components. The two component design is convenient because manufacturing of the conducting layer 502 within a package substrate is easily accomplished with minimal added cost. The conducting member 520 is also easily coupled to the conducting layer 502 in a manufacturing step that is inexpensive to produce.

The thermal bus 500 in this embodiment utilizes copper in fabricating the conductive layer 502 and the conducting member 520. However, any thermally conducting material may be used in place of copper. The copper material used in this embodiment is electrically conductive in addition to being thermally conductive. The thermal bus need not be electrically conductive to be within the scope of this invention, however if an electrically conductive material is used, the thermal bus may also be used to electrically ground a device such as a heat sink to a package substrate, thus protecting the die from electrical damage.

Figure 6:
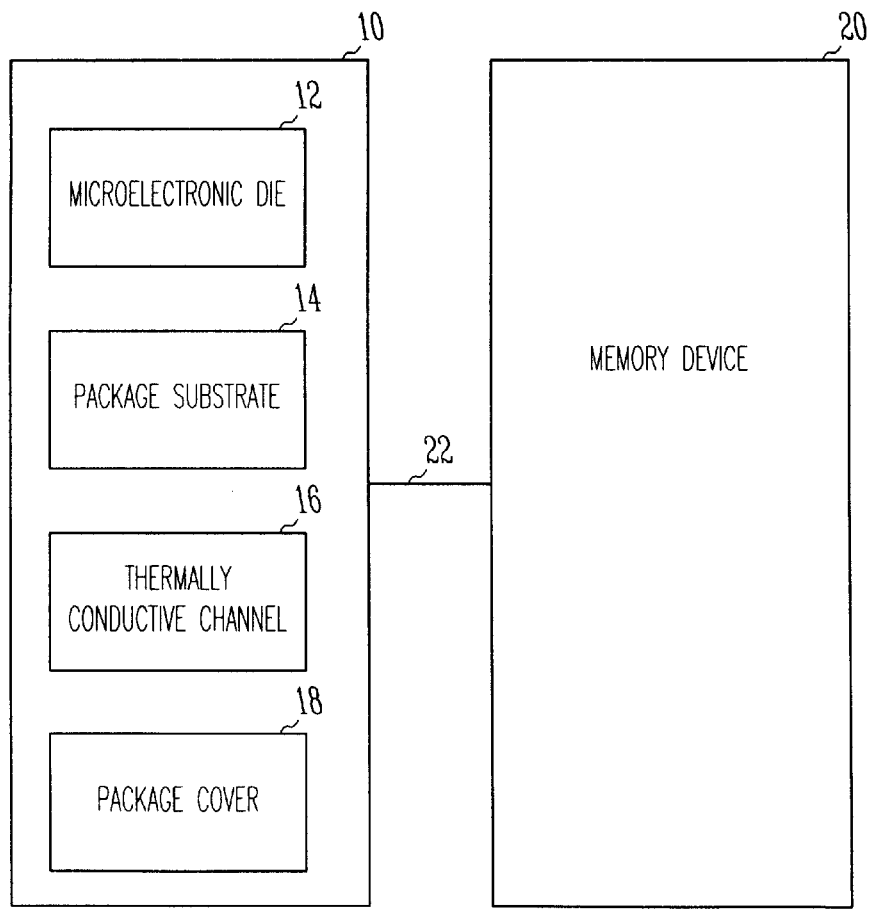
FIG. 6 shows an information handling system according to one embodiment of the invention.

FIG. 6 shows an electronic system 8 such as an information handling system that incorporates embodiments of a thermally conductive channel as described above. A processor chip package 10 is shown. The processor chip package 10 includes a microelectronic die 12, a package substrate 14, a thermally conductive channel 16 and a package cover 18. The processor chip package 10 is shown coupled to a memory device 20 by a system bus 22.

CONCLUSION

A novel thermal bus included in an innovative package design has been shown that more effectively transmits heat away from hot areas on the die. The innovative thermal bus is capable of transmitting heat to other heat dissipating devices such as heat sinks, and eventually transmitting the heat out to ambient. One aspect of the thermal bus leading to increased performance includes an added path for conducting heat in addition to the path through the backside of the die. Another aspect of the thermal bus leading to increased performance includes coupling the thermal bus to the active side of the die to more directly transmit heat from the electronic devices that are generating the heat. Local hot spots are therefore minimized, and the overall average temperature of the die is reduced, which allows improved performance of the microelectronic chip, such as operating at a higher frequency for a given upper threshold temperature.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

I claim:

1. An Integrated Circuit (IC) package, comprising:
   a package substrate;
   a microelectronic die having an active side and a backside, the microelectronic die mounted to the package substrate with the active side oriented toward the package substrate;
   a heat transfer device;
   a thermally conductive channel formed on the package substrate, including:
      a heat conducting layer having a first portion and a second portion, the first portion mounted between the package substrate and the active side;
      a conducting member having a first side and a second side, the first side being coupled to the second portion of the heat conducting layer and the second side being directly coupled to the heat transfer device;
      wherein heat is conducted from the first portion, through the heat conducting layer to the second portion, and into the conducting member.

2. The Integrated Circuit (IC) package of claim 1, wherein the heat conducting layer includes copper.

3. The Integrated Circuit (IC) package of claim 1, wherein the conducting member includes copper.

4. The Integrated Circuit (IC) package of claim 1, wherein the conducting member is soldered to the heat conducting layer.

5. An Integrated Circuit (IC) package, comprising:
   a package substrate;
   a microelectronic die having an active side and a backside, the microelectronic die mounted to the package substrate with the active side oriented toward the package substrate;
   a heat transfer device;
   a thermally conductive channel formed on the package substrate, including:
      a heat conducting layer having a first portion and a second portion, the first portion mounted between the active side of the microelectronic die and the package substrate; and
      a conducting member coupled to the second portion of the heat conducting layer and to the heat transfer device wherein heat is conducted from the first portion, through the heat conducting layer to the second portion, and into the conducting member.

6. The Integrated Circuit (IC) package of claim 5, wherein the heat transfer device is in thermal communication with the backside of the microelectronic die.

7. The Integrated Circuit (IC) package of claim 5, wherein the thermally conductive channel includes copper.

8. The Integrated Circuit (IC) package of claim 5, further comprising a thermal interface material located between the conducting member and the heat transfer device.

9. The Integrated Circuit (IC) package of claim 5, wherein the thermally conductive channel is electrically conductive, the conductive channel functioning as a ground between the heat transfer device and the package substrate.

10. The Integrated Circuit (IC) package of claim 5, wherein the heat transfer device includes a thermally conductive package cover.

11. The Integrated Circuit (IC) package of claim 10, wherein the conducting member is soldered to the heat conducting layer.

12. An information handling system, comprising:
   a memory device;
   a system bus coupled to the memory device;
   a processor chip package coupled the system bus, the processor chip package comprising:
      a package substrate;
      a microelectronic die having an active side and a backside, the microelectronic die mounted to the package substrate with the active side oriented toward the package substrate;
      a thermally conductive package cover located over the backside of the die; and
      a thermally conductive channel formed on the package substrate, including:
         a heat conducting layer having a first portion and a second portion, the first portion mounted between the active side of the microelectronic die and the package substrate; and a conducting member coupled to the second portion of the heat conducting layer, wherein heat is conducted from the first portion, through the heat conducting layer to the second portion, and into the conducting member.

13. The information handling system of claim 12, wherein the thermally conductive package cover is in thermal communication with the backside of the microelectronic die.

14. The information handling system of claim 12, wherein the thermally conductive channel includes copper.

15. The information handling system of claim 12, further comprising a thermal interface material located between the second portion of the thermally conductive channel and the thermally conductive package cover.

16. The information handling system of claim 13, further comprising a thermal interface material located between the backside of the microelectronic die and the thermally conductive package cover.

17. The information handling system of claim 12, wherein the heat conducting layer and the conducting member are integrally formed.

18. The information handling system of claim 12, wherein the conducting member is soldered to the heat conductive layer.

19. A method of cooling an Integrated Circuit (IC) die, comprising:

conducting heat from between a package substrate and a side of the die adjacent to the package substrate into a heat conducting channel located between the package substrate and the die, wherein the heat conducting channel includes a heat conducting layer having a first portion and a second portion, the first portion mounted between the side of the die adjacent to the package substrate and the package substrate; and a conducting member coupled to the second portion of the heat conducting layer;

conducting heat along the heat conducting channel to a location laterally spaced from the die; and conducting heat from the laterally space location to a thermally conductive package cover.

20. The method of claim 19 further comprising conducting heat from the thermally conducting package cover to a heat sink device.

21. The method of claim 19 wherein:

conducting heat from between a package substrate and a side of the die adjacent to the package substrate includes conducting heat from between a package substrate and an active side of the die adjacent to the package substrate.

22. The method of claim 19 wherein conducting heat along the heat conducting channel from the laterally spaced location to a thermally conductive package cover includes conducting heat through a thermal interface material between the heat conducting channel and the thermally conductive package cover.

* * * * *